United States Patent
So et al.

(10) Patent No.: US 9,949,402 B2
(45) Date of Patent: Apr. 17, 2018

(54) LIQUID LOOP COOLING APPARATUS, ELECTRONIC INSTRUMENT, AND METHOD FOR MANUFACTURING LIQUID LOOP COOLING APPARATUS

(71) Applicant: FUJITSU LIMITED, Kawasaki-shi, Kanagawa (JP)

(72) Inventors: Tsuyoshi So, Kawasaki (JP); Hideo Kubo, Kawasaki (JP); Yoshinori Uzuka, Kawasaki (JP); Nobumitsu Aoki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 32 days.

(21) Appl. No.: 15/269,182

(22) Filed: Sep. 19, 2016

(65) Prior Publication Data
US 2017/0127564 A1    May 4, 2017

(30) Foreign Application Priority Data

Oct. 30, 2015    (JP) .................. 2015-213952

(51) Int. Cl.
*H05K 7/20*    (2006.01)
(52) U.S. Cl.
CPC ..... *H05K 7/20309* (2013.01); *H05K 7/20136* (2013.01); *H05K 7/20318* (2013.01); *H05K 7/20327* (2013.01)

(58) Field of Classification Search
CPC .................. H05K 7/20309; H05K 7/20318
USPC .................................. 361/699–704
See application file for complete search history.

(56) References Cited

U.S. PATENT DOCUMENTS

| 7,068,509 B2* | 6/2006 | Bash ................. G06F 1/20 |
| | | 165/104.33 |
| 2005/0016715 A1* | 1/2005 | Werner .............. H01L 23/473 |
| | | 165/104.33 |
| 2005/0081534 A1* | 4/2005 | Suzuki .............. F28D 1/05366 |
| | | 62/50.2 |

FOREIGN PATENT DOCUMENTS

| JP | 2002-146830 | 5/2002 |
| JP | 2007-30744 | 2/2007 |

* cited by examiner

*Primary Examiner* — Mukund G Patel
(74) *Attorney, Agent, or Firm* — Fujitsu Patent Center

(57) ABSTRACT

A liquid loop cooling apparatus includes: an evaporator thermally coupled to a heating element; a condenser configured to be cooled by an airflow; a pump configured to circulate a refrigerant between the evaporator and the condenser; a first piping configured to couple the evaporator and the condenser; a second piping configured to couple the condenser and the pump; and a third piping configured to couple the pump and the evaporator, wherein the first piping is arranged on a destination side of the airflow, and the second piping is arranged on a source side of the airflow.

16 Claims, 9 Drawing Sheets

LIQUID LOOP COOLING APPARATUS, ELECTRONIC INSTRUMENT, AND METHOD FOR MANUFACTURING LIQUID LOOP COOLING APPARATUS

CROSS-REFERENCE TO RELATED APPLICATION

This application is based upon and claims the benefit of priority of the prior Japanese Patent Application No. 2015-213952, filed on Oct. 30, 2015, the entire contents of which are incorporated herein by reference.

FIELD

The embodiment discussed herein is related to a liquid loop cooling apparatus, an electronic instrument, and a method for manufacturing the liquid loop cooling apparatus.

BACKGROUND

Along with the promotion of enhancement in the performance of servers and other electronic instruments, the amount of heat generation of an electronic part, such as a central processing unit (CPU), tends to increase.

An example of related art is disclosed in Japanese Laid-open Patent Publication No. 2002-146830 or Japanese Laid-open Patent Publication No. 2007-30744.

SUMMARY

According to an aspect of the embodiments, a liquid loop cooling apparatus includes: an evaporator thermally coupled to a heating element; a condenser configured to be cooled by an airflow; a pump configured to circulate a refrigerant between the evaporator and the condenser; a first piping configured to couple the evaporator and the condenser; a second piping configured to couple the condenser and the pump; and a third piping configured to couple the pump and the evaporator, wherein the first piping is arranged on a destination side of the airflow, and the second piping is arranged on a source side of the airflow.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An excess of the temperature of an electronic part, such as a CPU, over a highest allowable temperature causes a malfunction, a failure, or a decline in processing power. A unit which cools an electronic part is thus provided.

For example, as one of units which cool an electronic part, a liquid closed-loop cooling apparatus is provided. The liquid closed-loop cooling apparatus includes an evaporator, a condenser, and piping and a pump that circulate a refrigerant between the evaporator and the condenser. The evaporator is placed on an electronic part and is thermally connected to the electronic part. The condenser is arranged at a location to which cool air is supplied by a blower fan or the like.

In the liquid closed-loop cooling apparatus, the refrigerant circulates between the evaporator and the condenser, and a large amount of heat is transported from the evaporator to the condenser using heat of evaporation generated when the refrigerant evaporates and heat of condensation generated when the refrigerant liquefies. For this reason, even if the electronic part is large in the amount of heat generation, the temperature of the electronic part is maintained not more than a highest allowable temperature, and an electronic instrument using the electronic part operates stably.

For example, a cooling apparatus used in a construction machine or a hybrid electric vehicle is provided.

There is demand for a reduction in size of and energy saving in electronic instruments including a liquid closed-loop cooling apparatus.

Figure 1:
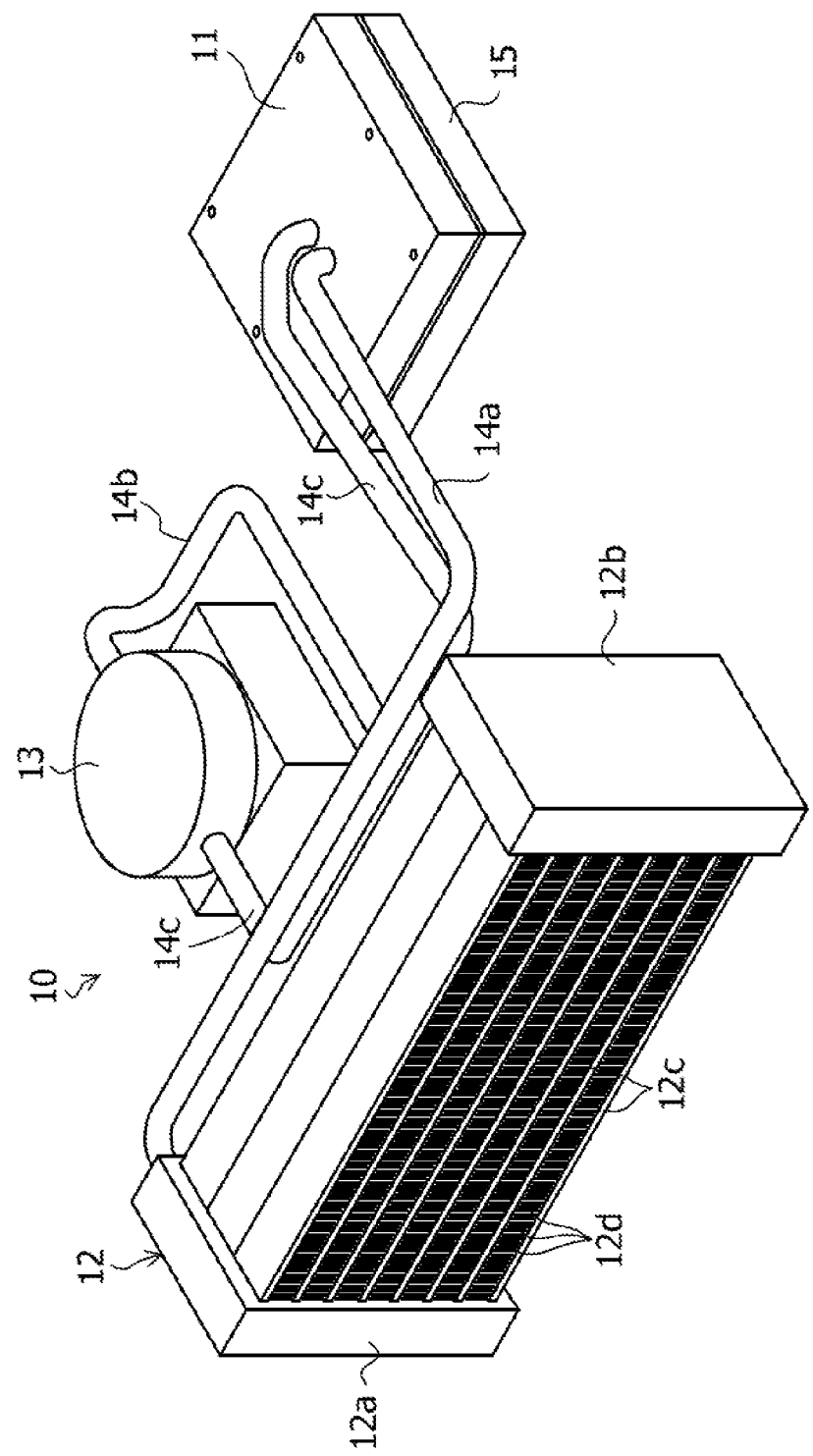
FIG. 1 illustrates an example of a perspective view of a liquid closed-loop cooling apparatus.
Figure 2:
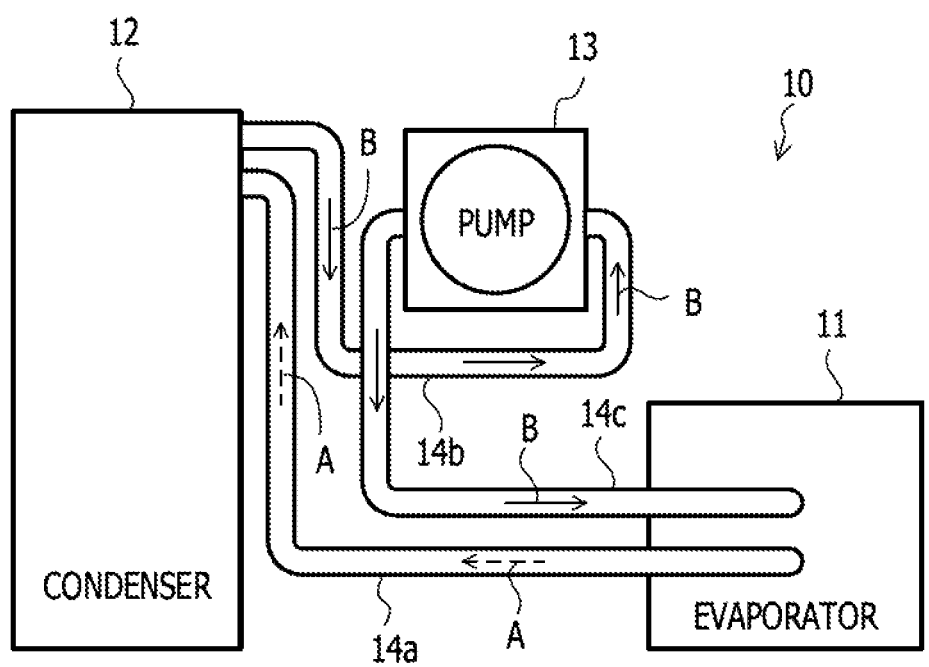
FIG. 2 illustrates an example of a top view of the liquid closed-loop cooling apparatus.

FIG. 1 illustrates an example of a perspective view of a liquid closed-loop cooling apparatus. FIG. 2 illustrates an example of a top view of the liquid closed-loop cooling apparatus. An arrow A in FIG. 2 indicates a direction in which a refrigerant in a gaseous state moves, and an arrow B indicates a direction in which the refrigerant in a liquid state moves.

A liquid closed-loop cooling apparatus 10 illustrated in FIGS. 1 and 2 includes an evaporator 11, a condenser 12, and a pump 13 and pieces 14a, 14b, and 14c of piping which circulate a refrigerant between the evaporator 11 and the condenser 12. For example, water, alcohol, or the like may be used as the refrigerant. A space inside the liquid closed-loop cooling apparatus 10 has a reduced pressure to promote evaporation of the refrigerant.

A refrigerant outlet of the evaporator 11 and a refrigerant inlet of the condenser 12 are connected by the piece 14a of piping. A refrigerant outlet of the condenser 12 and a suction port (suction) of the pump 13 are connected by the piece 14b of piping. A delivery port (delivery) of the pump 13 and a refrigerant inlet of the evaporator 11 are connected by the piece 14c of piping.

The evaporator 11 is equipped on an electronic part 15. The electronic part 15 and the evaporator 11 are thermally connected via, for example, silicon grease arranged between the electronic part 15 and the evaporator 11. For this reason, heat generated upon operation of the electronic part 15 transfers promptly to the evaporator 11.

The refrigerant in a liquid state that flows through the evaporator 11 is warmed by heat transmitted from the electronic part 15 to turn into gas. The refrigerant gasified inside the evaporator 11 moves to the condenser 12 through the piece 14a of piping.

The condenser 12 illustrated in FIG. 1 includes headers 12a and 12b, a plurality of refrigerant pipes 12c which are arranged in parallel between the headers 12a and 12b and through which the refrigerant passes, and a large number of fins 12d for heat dissipation which are arranged along a longitudinal direction of the refrigerant pipe 12c.

The header 12a is partitioned into a first space which communicates with the refrigerant inlet and a second space which communicates with the refrigerant outlet. The refrigerant entering into the header 12a through the refrigerant inlet moves from the first space to the header 12b through the outward refrigerant pipes 12c and moves from the header 12b to the second space inside the header 12a through the homeward refrigerant pipes 12c.

The refrigerant is cooled by cool air passing between the fins 12d while the refrigerant passes through the refrigerant pipes 12c. The refrigerant changes in state from gas to liquid. The refrigerant liquefied inside the condenser 12 moves to the pump 13 through the piece 14b of piping and is sent from the pump 13 to the evaporator 11 through the piece 14c of piping.

As described earlier, the space inside the liquid closed-loop cooling apparatus 10 has a reduced pressure. In order to avoid deformation due to the reduced pressure, a piece of piping of a metal, such as copper or stainless steel, may be used as each of the pieces 14a, 14b, and 14c of piping.

At the time of assembly of the liquid closed-loop cooling apparatus 10, each piece of piping may be connected using solder (a low-melting metal) based on silver, copper, zinc, or the like. A thermal failure of a resin part inside the pump 13 may be avoided at the time of brazing work.

The liquid closed-loop cooling apparatus 10 uses the pump 13. The pump 13 has pieces of piping with a desired length (of, for example, about 150 mm) attached in advance at the suction port and the delivery port. For this reason, at the time of assembly of the liquid closed-loop cooling apparatus 10, a point of brazing may be set at a position away from the pump 13, and a thermal failure of a resin part inside the pump 13 may be avoided. The piping length of the piece 14b of piping between the condenser 12 and the pump 13 and that of the piece 14c of piping between the pump 13 and the evaporator 11 may be both long.

In terms of space saving and handling convenience, the condenser 12 and the pump 13 may be closely arranged. For example, if the piping length of the piece 14b of piping between the condenser 12 and the pump 13 is long, the number of bent portions of the piece 14b of piping is large, and the radius of curvature of each bent portion is small, as illustrated in FIGS. 1 and 2. The passage resistance of the piece 14b of piping may be thereby high. In this case, the pump 13 may be increased in power consumption or in size in order to circulate a sufficient amount of refrigerant between the evaporator 11 and the condenser 12.

Figure 3:
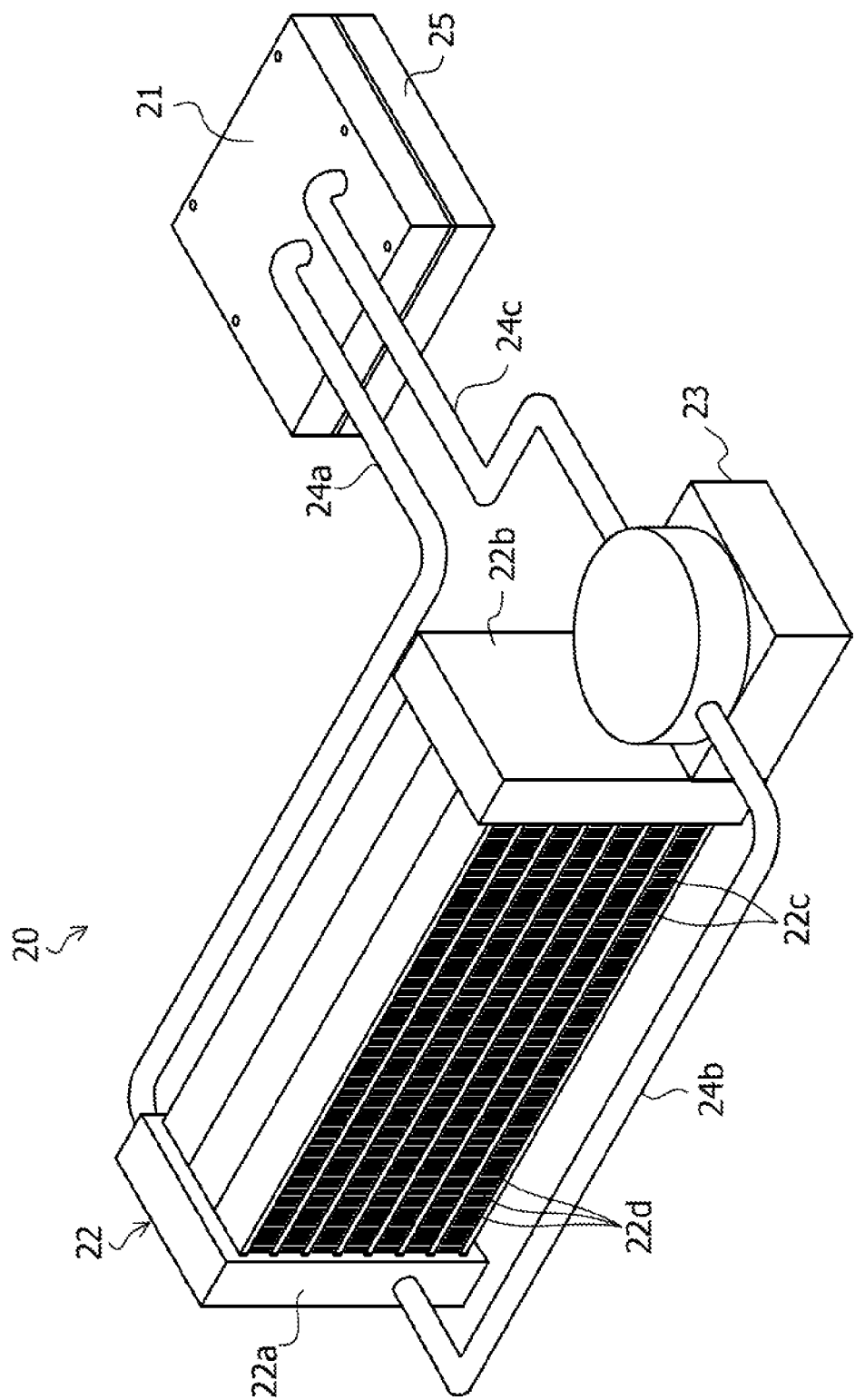
FIG. 3 illustrates an example of a perspective view of a liquid closed-loop cooling apparatus.
Figure 4:
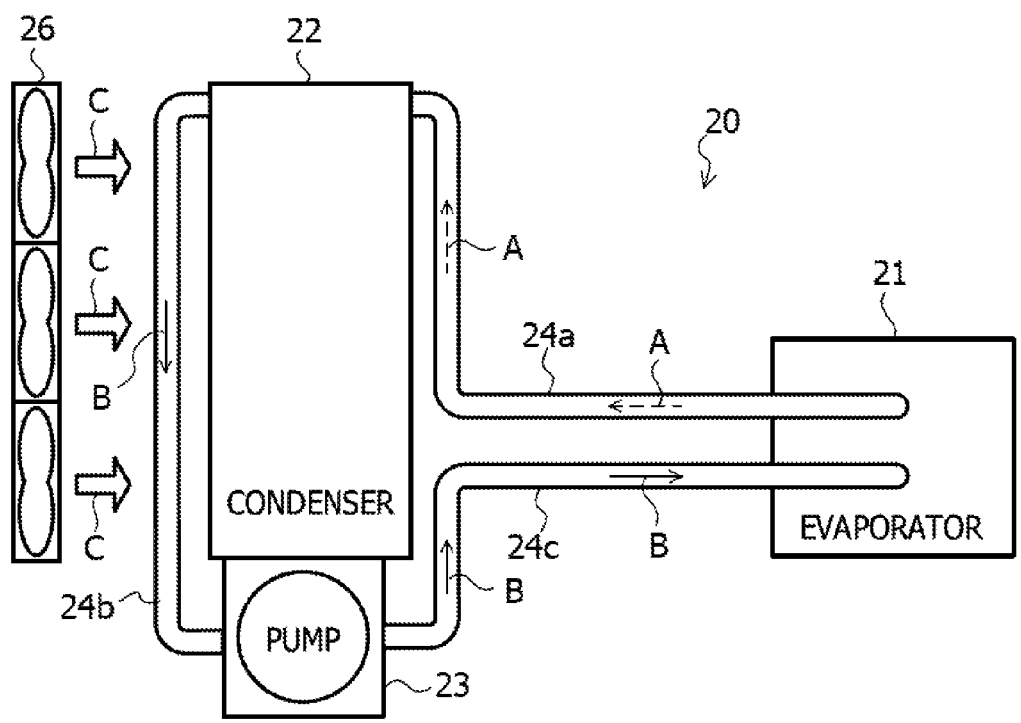
FIG. 4 illustrates an example of a top view of the liquid closed-loop cooling apparatus.

FIG. 3 illustrates an example of a perspective view of a liquid closed-loop cooling apparatus. FIG. 4 illustrates an example of a top view of the liquid closed-loop cooling apparatus. An arrow A in FIG. 4 indicates a direction in which a refrigerant in a gaseous state moves, an arrow B indicates a direction in which the refrigerant in a liquid state moves, and an arrow C indicates a direction in which air (cooling air) moves by a blower fan 26.

As illustrated in FIGS. 3 and 4, a liquid closed-loop cooling apparatus 20 includes an evaporator 21, a condenser 22, and a pump 23 and pieces 24a, 24b, and 24c of piping which circulate a refrigerant between the evaporator 21 and the condenser 22. The blower fan 26 is arranged in the vicinity of the condenser 22, and cool air is sent from the blower fan 26 into between fins of the condenser 22.

In the liquid closed-loop cooling apparatus 20, a refrigerant outlet of the condenser 22 is provided on the blower fan 26 side (the windward side), and a refrigerant inlet is provided on the opposite side (the leeward side). The pump 23 is arranged lateral to the condenser 22. For example, the pump 23 is arranged at a side of the condenser 22 when viewed from the source side of an airflow from the blower fan 26. The evaporator 21 is arranged across the condenser 22 and the pump 23 from the blower fan 26.

For example, an internal passage, through which the refrigerant flows, is provided inside the evaporator 21. The evaporator 21 is placed on an electronic part 25. The electronic part 25 and the evaporator 21 are thermally connected via, for example, silicon grease or the like arranged between the electronic part 25 and the evaporator 21. In the evaporator 21 illustrated in FIGS. 3 and 4, a refrigerant inlet and a refrigerant outlet which communicate with the internal passage are provided in an upper surface. The electronic part 25 may be an example of a heating element.

The refrigerant outlet of the evaporator 21 and the refrigerant inlet of the condenser 22 are connected by the piece 24a of piping. The refrigerant outlet of the condenser 22 and a suction port of the pump 23 are connected by the piece 24b of piping. A delivery port of the pump 23 and the refrigerant inlet of the evaporator 21 are connected by the piece 24c of piping.

The pieces 24a, 24b, and 24c of piping may be made of, for example, a metal, such as copper or stainless steel. The piece 24a of piping may be an example of a piece of first piping. The piece 24b of piping may be an example of a piece of second piping. The piece 24c of piping may be an example of a piece of third piping.

For example, water, alcohol, or the like may be sealed as the refrigerant in a space inside the liquid closed-loop cooling apparatus 20. The space inside the liquid closed-loop cooling apparatus 20 has a reduced pressure to promote evaporation of the refrigerant. For example, as illustrated in FIGS. 3 and 4, the piece 24a of piping that connects the evaporator 21 and the condenser 22 is arranged on the leeward side of the condenser 22, and the piece 24b of piping that connects the condenser 22 and the pump 23 is arranged on the windward side of the condenser 22.

The condenser 22 includes headers 22a and 22b, a plurality of refrigerant pipes 22c which are arranged in parallel between the headers 22a and 22b and through which the refrigerant passes, and a large number of fins 22d for heat dissipation which are arranged along a longitudinal direction of the refrigerant pipe 22c.

The header 22a is partitioned into a first space which communicates with the refrigerant inlet and a second space which communicates with the refrigerant outlet. The refrigerant entering into the header 22a through the refrigerant inlet moves to the header 22b through the outward refrigerant pipes 22c that are connected to the first space and moves from the header 22b to the second space inside the header 22a through the homeward refrigerant pipes 22c.

The refrigerant is cooled by cool air passing between the fins 22d while the refrigerant passes through the refrigerant pipes 22c. The refrigerant changes in state (phase) from gas to liquid. The refrigerant liquefied inside the condenser 22 moves to the pump 23 through the piece 24b of piping connected to the refrigerant outlet of the header 22a and is sent from the pump 23 to the evaporator 21.

The liquid closed-loop cooling apparatus 20 causes the pump 23 to circulate the refrigerant between the evaporator 21 and the condenser 22. The refrigerant draws heat (heat of evaporation) away from the evaporator 21 when the refrigerant is warmed by heat transmitted from the electronic part 25 and turns into gas inside the evaporator 21. This cools the electronic part 25.

The refrigerant in a gaseous state appearing in the evaporator 21 moves to the condenser 22. In the condenser 22, the refrigerant is cooled by cool air sent from the blower fan 26 and changes in state from gas to liquid. When the refrigerant changes in state from gas to liquid, heat of condensation is released. The heat of condensation released from the refrigerant is transmitted to cool air passing between the fins 22d and is finally emitted into an atmosphere.

The refrigerant liquefied in the condenser 22 moves into the pump 23 via the piece 24b of piping. The refrigerant in a liquid state is sent to the evaporator 21 by the pump 23.

As described above, in the liquid closed-loop cooling apparatus 20, the pump 23 causes the refrigerant to circulate between the evaporator 21 and the condenser 22, and a large amount of heat is transported from the evaporator 21 to the condenser 22 using heat of evaporation generated when the refrigerant gasifies and heat of condensation generated when the refrigerant liquefies. For this reason, even if the electronic part 25 is large in the amount of heat generation, the temperature of the electronic part 25 may be maintained not more than a highest allowable temperature.

At the time of assembly of the liquid closed-loop cooling apparatus 20, pieces of piping with a desired length (of, for example, about 150 mm) are attached in advance at the suction port and the delivery port of the pump 23. The pieces of piping are brazed to a piece of piping connected to the refrigerant outlet of the condenser 22 and a piece of piping connected to the refrigerant inlet of the evaporator 21. Since a point of brazing may be located away from the pump 23, a thermal failure due to heat at the time of brazing work of a resin part inside the pump 23 may be avoided.

As illustrated in FIGS. 3 and 4, in the liquid closed-loop cooling apparatus 20, the refrigerant outlet of the condenser 22 is arranged in a surface on the windward side of the header 22a. The pump 23 is arranged adjacent to the header 22b. The piece 24b of piping that connects the refrigerant outlet of the condenser 22 and the suction port of the pump 23 is arranged on the windward side of the condenser 22.

This arrangement may reduce the number of bent portions of the piece 24b of piping that connects the refrigerant outlet of the condenser 22 and the suction port of the pump 23. As a result, the passage resistance of the piece 24b of piping that connects the refrigerant outlet of the condenser 22 and the suction port of the pump 23 may be reduced.

In the liquid closed-loop cooling apparatus 10 illustrated in FIGS. 1 and 2, the pump 13 is arranged near the refrigerant inlet of the condenser 12, which reduces the radius of curvature of each bent portion of the piece 14b of piping. In the liquid closed-loop cooling apparatus 20 illustrated in FIGS. 3 and 4, the refrigerant outlet of the condenser 22 and the pump 23 are arranged away from each other, which increases the radius of curvature of each bent portion of the piece 24b of piping. This configuration may make the passage resistance of the piece 24b of piping much lower.

Since the passage resistance of the piece 24b of piping between the condenser 22 and the pump 23 is low, a sufficient amount of refrigerant may be circulated between the evaporator 21 and the condenser 22 by the relatively small pump 23.

For example, the width of the condenser 22 may be 380 mm, the inner diameter of the piece 24b of piping may be 4.75 mm, and the length of the piece 24b of piping may be 400 mm. The liquid closed-loop cooling apparatus 20 illustrated in FIGS. 3 and 4 may be expected to produce the effect of increasing in flow rate by about 8% over the liquid closed-loop cooling apparatus 10 illustrated in FIGS. 1 and 2 even if the same pump is used.

Since the piece 24b of piping is arranged on the windward side of the condenser 22 in the liquid closed-loop cooling apparatus 20 illustrated in FIGS. 3 and 4, the refrigerant flowing through the piece 24b of piping is cooled directly by cool air sent from the blower fan 26. With this configuration, the temperature of the refrigerant sent to the evaporator 21 via the pump 23 may be lower than in the liquid closed-loop cooling apparatus 10 illustrated in FIGS. 1 and 2.

For example, the width of the condenser 22 may be 380 mm, the inner diameter of the piece 24b of piping may be 4.75 mm, and the length of the piece 24b of piping may be 400 mm. In this case, the liquid closed-loop cooling apparatus 20 illustrated in FIGS. 3 and 4 may be expected to produce the effect of increasing in cooling capacity by about 3% over a case where a piece of piping between a condenser and a pump is arranged on the leeward side of the condenser.

Owing to the two effects described above, the liquid closed-loop cooling apparatus 20 illustrated in FIGS. 3 and 4 may be expected to increase in cooling capacity by about 11% over the liquid closed-loop cooling apparatus 10 illustrated in FIGS. 1 and 2. Thus, the liquid closed-loop cooling apparatus 20 illustrated in FIGS. 3 and 4 achieves a much larger size reduction and a much higher level of energy saving than the liquid closed-loop cooling apparatus 10 illustrated in FIGS. 1 and 2.

Figure 5:
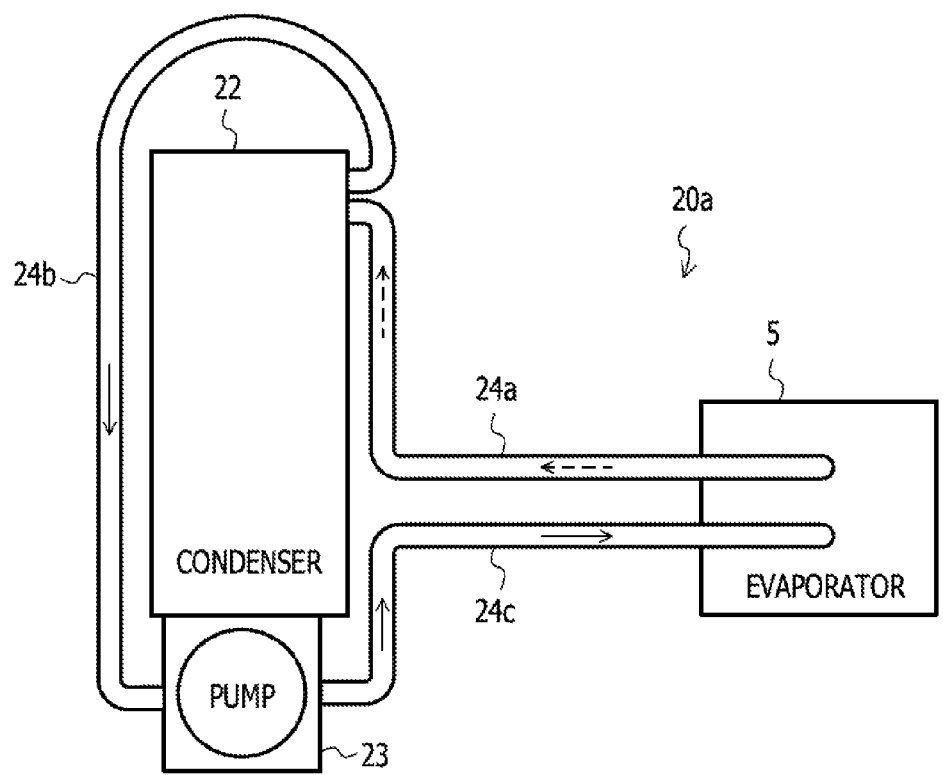
FIG. 5 illustrates an example of a top view of a liquid closed-loop cooling apparatus.

FIG. 5 illustrates an example of a top view of a liquid closed-loop cooling apparatus. The same components in FIG. 5 as those in FIG. 4 are denoted by the same reference characters, and a detailed description thereof may be omitted.

In the liquid closed-loop cooling apparatus 20 illustrated in FIGS. 3 and 4, the refrigerant outlet is provided in the surface on the windward side of the condenser 22. In contrast, in a liquid closed-loop cooling apparatus 20a illustrated in FIG. 5, a refrigerant outlet is provided in a surface on the leeward side of the condenser 22. A refrigerant in a liquid state exiting from the refrigerant outlet of the condenser 22 moves to the windward side of the condenser 22 through the piece 24b of piping that is curved with a large radius of curvature and enters into a suction port of the pump 23.

In the liquid closed-loop cooling apparatus 20a illustrated in FIG. 5 as well, since the passage resistance of the piece 24b of piping is low, a sufficient amount of refrigerant may be circulated between the evaporator 21 and the condenser 22 by the relatively small pump 23.

Since the piece 24b of piping is arranged on the windward side of the condenser 22, the refrigerant flowing through the piece 24b of piping is cooled directly by cool air sent from the blower fan 26. With this configuration, the temperature of the refrigerant sent to the evaporator 21 via the pump 23 may be lower than in the liquid closed-loop cooling apparatus 10 illustrated in FIGS. 1 and 2.

Figure 6:
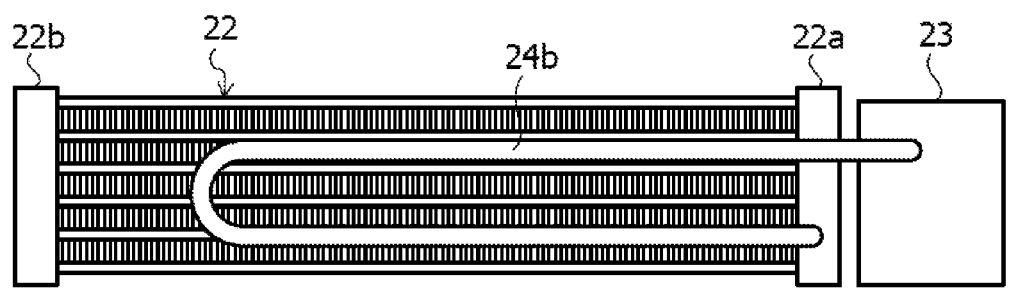
FIG. 6 illustrates an example of a plan view of a liquid closed-loop cooling apparatus when viewed from the windward side of a condenser.

FIG. 6 illustrates an example of a plan view of a liquid closed-loop cooling apparatus when viewed from the windward side of the condenser 22. The same components in FIG. 6 as those in FIG. 3 are denoted by the same reference characters, and a detailed description thereof may be omitted.

In the liquid closed-loop cooling apparatus illustrated in FIG. 6, the pump 23 is arranged lateral to (at a side of) the condenser 22. A refrigerant outlet of the header 22a is provided in a surface on the windward side, and the refrigerant outlet and a suction port of the pump 23 are connected by the piece 24b of piping that is arranged on the windward side of the condenser 22.

As illustrated in FIG. 6, the piece 24b of piping is sharply curved in a U-shape. This may avoid an increase in the passage resistance of the piece 24b of piping and ensure a desired piping length. Since the piece 24b of piping is arranged on the windward side of the condenser 22, the temperature of a refrigerant flowing through the piece 24b of piping may be much lower.

Figure 7:
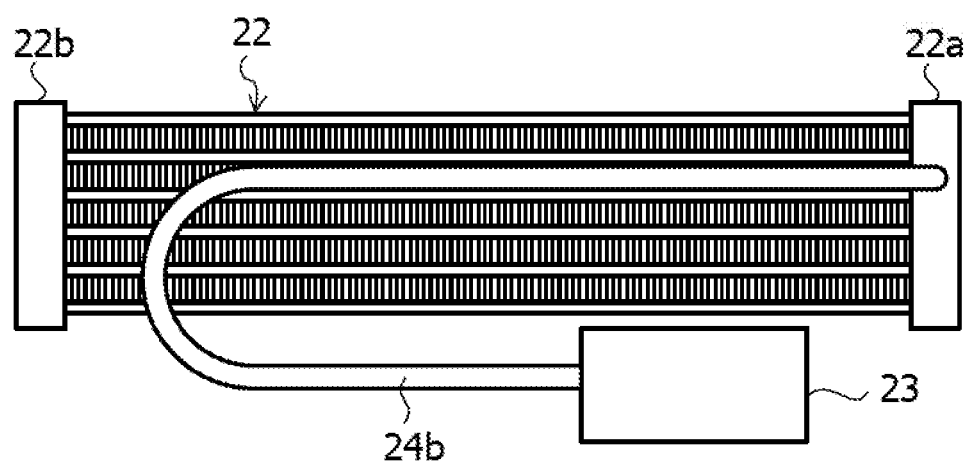
FIG. 7 illustrates an example of a plan view of a liquid closed-loop cooling apparatus when viewed from the windward side of the condenser.

FIG. 7 illustrates an example of a plan view of a liquid closed-loop cooling apparatus when viewed from the windward side of the condenser 22. The same components in FIG. 7 as those in FIG. 3 are denoted by the same reference characters, and a detailed description thereof may be omitted.

In the liquid closed-loop cooling apparatus illustrated in FIG. 7, the pump 23 is arranged below the condenser 22. A refrigerant outlet of the header 22a is provided in a surface on the windward side, and the refrigerant outlet and a suction port of the pump 23 are connected by the piece 24b of piping that is arranged on the windward side of the condenser 22.

In the liquid closed-loop cooling apparatus illustrated in FIG. 7, the piece 24b of piping is sharply curved in a U-shape, as in FIG. 6. This may avoid an increase in the passage resistance of the piece 24b of piping and ensure a desired piping length. Since the piece 24b of piping is arranged on the windward side of the condenser 22, the temperature of a refrigerant flowing through the piece 24b of piping may be much lower.

Figure 8:
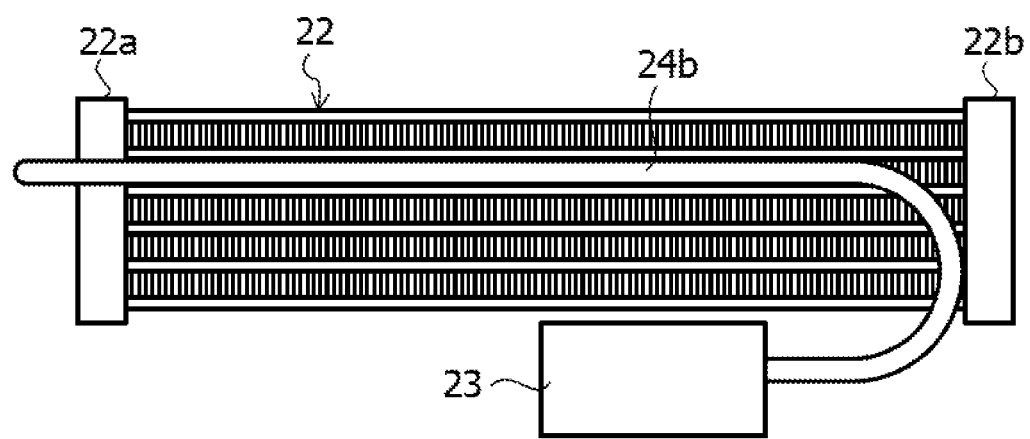
FIG. 8 illustrates an example of a plan view of a liquid closed-loop cooling apparatus when viewed from the windward side of the condenser.

FIG. 8 illustrates an example of a plan view of a liquid closed-loop cooling apparatus when viewed from the windward side of the condenser 22. The same components in FIG. 8 as those in FIG. 3 are denoted by the same reference characters, and a detailed description thereof may be omitted.

In the liquid closed-loop cooling apparatus illustrated in FIG. 8, the pump 23 is arranged below the condenser 22. A refrigerant outlet of the header 22a is provided in a surface on the leeward side, and the refrigerant outlet and a suction port of the pump 23 are connected by the piece 24b of piping that is sharply curved as in FIG. 5. The piece 24b of piping runs on the windward side of the condenser 22 and is connected to the suction port of the pump 23.

In FIG. 8 as well, the refrigerant outlet of the header 22a and the suction port of the pump 23 are connected via the piece 24b of piping sharply curved. This may avoid an increase in the passage resistance of the piece 24b of piping and ensure a desired piping length. Since the piece 24b of piping is arranged on the windward side of the condenser 22, the temperature of a refrigerant flowing through the piece 24b of piping may be much lower.

In FIGS. 7 and 8, the pump 23 is arranged below the condenser 22. The pump 23, however, may be arranged above the condenser 22.

Figure 9:
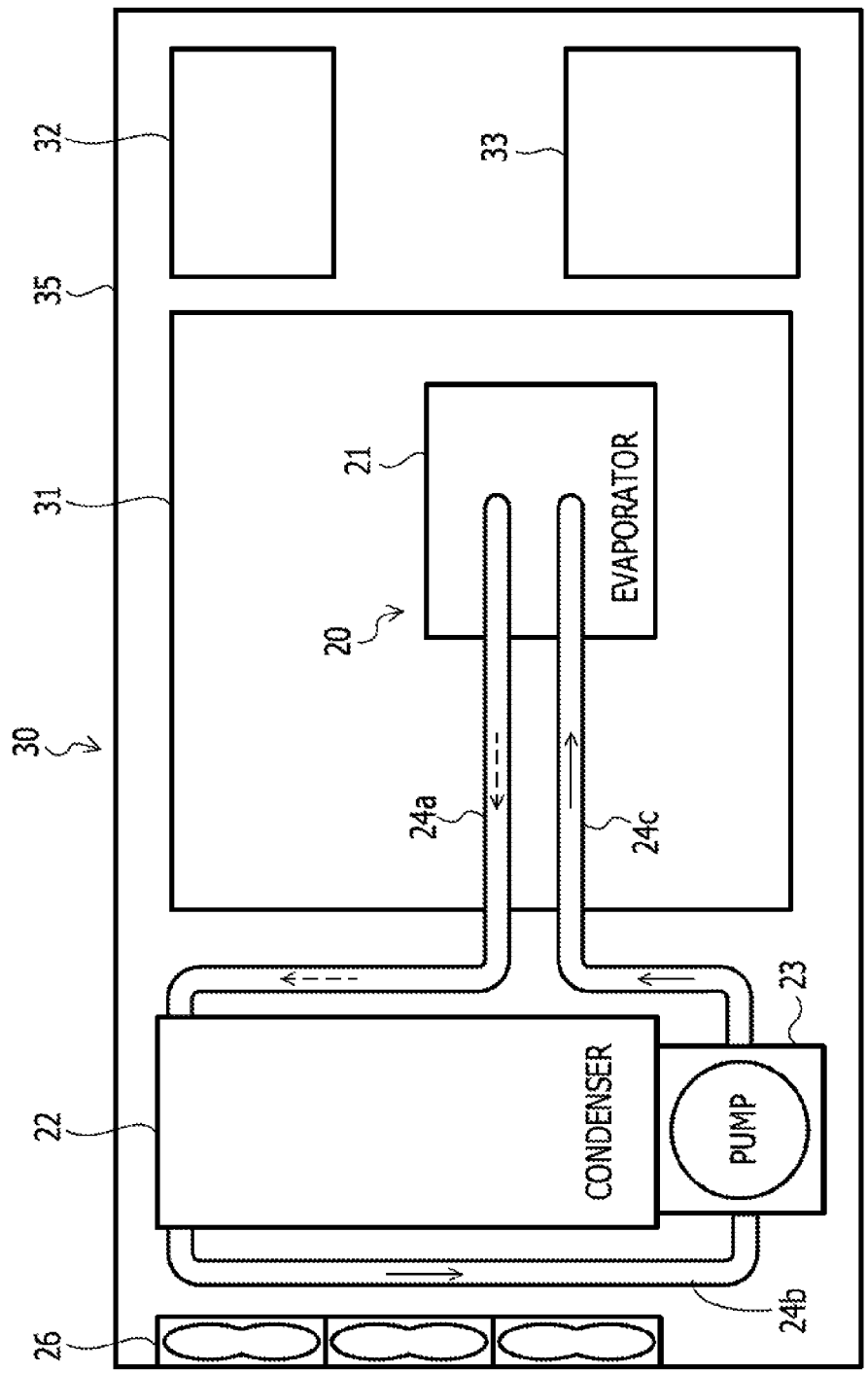
FIG. 9 illustrates an example of a top view of an electronic instrument.

FIG. 9 illustrates an example of an electronic instrument. For example, the electronic instrument may be a server.

An electronic instrument 30 illustrated in FIG. 9 includes a circuit board 31, the liquid closed-loop cooling apparatus 20, the blower fan 26, a storage 32, a power source 33, and a housing 35 which houses the components. As illustrated in FIG. 3, the liquid closed-loop cooling apparatus 20 includes the evaporator 21, the condenser 22, and the pump 23 and the pieces 24a, 24b, and 24c of piping that circulate a refrigerant between the evaporator 21 and the condenser 22.

The circuit board 31 is equipped with, for example, the electronic part 25 (see FIG. 3) large in the amount of heat generation and other electronic parts. The evaporator 21 of the liquid closed-loop cooling apparatus 20 is placed on the electronic part 25.

As illustrated in FIG. 9, in the electronic instrument 30, the pump 23 is arranged at a side of the condenser 22, and the piece 24b of piping that connects the condenser 22 and the pump 23 is arranged on the windward side of the condenser 22. Thus, the passage resistance of the piece 24b of piping between the condenser 22 and the pump 23 may be low.

For this reason, a sufficient amount of refrigerant is circulated between the evaporator 21 and the condenser 22 by the relatively small pump 23. As a result, a reduction in size of and energy saving in the electronic instrument 30 may be achieved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A liquid loop cooling apparatus comprising:
   an evaporator thermally coupled to a heating element;
   a condenser configured to be cooled by an airflow;
   a pump configured to circulate a refrigerant between the evaporator and the condenser;
   a first piping configured to couple the evaporator and the condenser;
   a second piping configured to couple the condenser and the pump; and
   a third piping configured to couple the pump and the evaporator,
   the second piping outputs from a first surface of the condenser which faces an air outlet of a fan, which is provided on an opposite side of the evaporator across the condenser, extends along the air outlet between the air outlet and the first surface, and is coupled to a sidewall of the pump which is provided along a second surface of the condenser perpendicular to the first surface,
   the first piping is provided between a third surface of the condenser opposite to the first surface and the evaporator.

2. The liquid loop cooling apparatus according to claim 1, wherein the evaporator is arranged on a leeward side of the condenser.

3. The liquid loop cooling apparatus according to claim 1, wherein the pump is arranged at a side of the condenser when viewed from the source side of the airflow.

4. The liquid loop cooling apparatus according to claim 1, wherein the refrigerant changes in state from liquid to gas by heat transmitted from the heating element, and is cooled by the airflow and changes in state from gas to liquid inside the condenser.

5. The liquid loop cooling apparatus according to claim 1, wherein the first piping, the second piping, and the third piping are each made of metal.

6. An electronic instrument comprising:
a circuit board equipped with an electronic part;
a blower fan;
a liquid loop cooling apparatus; and
a housing configured to house the circuit board, the blower fan, and the liquid loop cooling apparatus,
the liquid loop cooling apparatus includes:
an evaporator thermally coupled to the electronic part;
a condenser configured to be cooled by an airflow produced by the blower fan;
a pump configured to circulate a refrigerant between the evaporator and the condenser;
a first piping configured to be couple the evaporator and the condenser;
a second piping configured to couple the condenser and the pump; and
a third piping configured to couple the pump and the evaporator,
the second piping outputs from a first surface of the condenser which faces an air outlet of the blower fan, which is provided on an opposite side of the evaporator across the condenser, extends along the air outlet between the air outlet and the first surface, and is coupled to a sidewall of the pump which is provided along a second surface of the condenser perpendicular to the first surface,
the first piping is provided between a third surface of the condenser opposite to the first surface and the evaporator.

7. The electronic instrument according to claim 6, wherein the evaporator is arranged on a leeward side of the condenser.

8. The electronic instrument according to claim 6, wherein the pump is arranged at a side of the condenser when viewed from the source side of the airflow.

9. The electronic instrument according to claim 6, wherein the refrigerant changes in state from liquid to gas by heat transmitted from the heating element, and is cooled by the airflow and changes in state from gas to liquid inside the condenser.

10. The electronic instrument according to claim 6, wherein the first piping, the second piping, and the third piping are each made of metal.

11. A method of manufacturing a liquid loop cooling apparatus, the method comprising:
arranging a condenser that is cooled by an airflow produced by a fan in such a manner that a first surface of the condenser faces an air outlet of the fan;
arranging an evaporator thermally coupled to a heating element on an opposite side of the fan across the condenser;
arranging a pump adjacent to the condenser;
arranging a second piping in such a manner that the second piping outputs from a first surface of the condenser which faces the air outlet, extends along the air outlet between the air outlet and the first surface, and is coupled to a sidewall of the pump which is provided along a second surface of the condenser perpendicular to the first surface;
coupling the evaporator and the condenser by a first piping which is provided between a third surface of the condenser opposite to the first surface and the evaporator; and
coupling the evaporator and the delivery port of the pump by a third piping.

12. The method according to claim 11, wherein the coupling by the first piping, the coupling by the second piping, and the coupling by the third piping are performed by brazing.

13. The method according to claim 11, wherein the pump is arranged at a side of the condenser when viewed from the source side of the airflow.

14. The method according to claim 11, wherein the pump circulates a refrigerant between the evaporator and the condenser.

15. The method according to claim 14, wherein the refrigerant changes in state from liquid to gas by heat transmitted from the heating element, and is cooled by the airflow and changes in state from gas to liquid inside the condenser.

16. The method according to claim 11, wherein the first piping, the second piping, and the third piping are each made of metal.

* * * * *